United States Patent [19]
Akioka et al.

[11] Patent Number: 5,787,043
[45] Date of Patent: Jul. 28, 1998

[54] SEMICONDUCTOR MEMORY DEVICE HAVING A REDUNDANCY CAPABILITY

[75] Inventors: Takashi Akioka; Yuji Yokoyama, both of Hitachi; Atsushi Hiraishi, Oume; Masahiro Iwamura, Hitachi; Yutaka Kobayashi, Katsuta; Tatsumi Yamauchi, Hitachi; Shigeru Takahashi, Hitachiohta; Koichi Motohashi, Kodaira, all of Japan

[73] Assignee: Hitachi, Ltd., Tokyo, Japan

[21] Appl. No.: 394,765

[22] Filed: Feb. 27, 1995

Related U.S. Application Data

[63] Continuation of Ser. No. 100,202, Aug. 2, 1993, abandoned, which is a continuation of Ser. No. 585,239, Sep. 20, 1990, abandoned.

[30] Foreign Application Priority Data

Sep. 20, 1989 [JP] Japan ................................ 1-242125

[51] Int. Cl.$^6$ .......................... G11C 7/00; G11C 29/00
[52] U.S. Cl. ............... 365/200; 365/230.03; 365/230.06
[58] Field of Search ............................. 365/200, 230.03, 365/230.06; 371/10.2

[56] References Cited

U.S. PATENT DOCUMENTS

| | | | |
|---|---|---|---|
| 4,346,459 | 8/1982 | Sud et al. | 365/200 |
| 4,656,610 | 4/1987 | Yoshida et al. | 371/10.1 |
| 4,727,513 | 2/1988 | Clayton | 365/52 |
| 4,727,516 | 2/1988 | Yoshida et al. | 365/200 |
| 5,012,408 | 4/1991 | Conroy | 364/245.3 |
| 5,021,944 | 6/1991 | Sasaki et al. | 365/200 |
| 5,255,228 | 10/1993 | Hatta et al. | 365/230.03 |
| 5,265,055 | 11/1993 | Horiguchi et al. | 365/200 |
| 5,270,975 | 12/1993 | McAdams | 365/200 |
| 5,270,976 | 12/1993 | Tran | 365/200 |
| 5,289,417 | 2/1994 | Ooishi et al. | 365/230.06 |

FOREIGN PATENT DOCUMENTS

| | | |
|---|---|---|
| 57-74899 | 5/1982 | Japan . |
| 63-37900 | 2/1988 | Japan . |

*Primary Examiner*—Huan Hoang
*Attorney, Agent, or Firm*—Antonelli, Terry, Stout & Kraus, LLP

[57] ABSTRACT

A semiconductor device is provided which comprises a memory mat formed by dividing a memory into a plurality of blocks and a circuit arrangement disposed at every memory mat block for generating access suppression signals at least for defective memory cells within that block. Using this arrangement, the access speed to a redundant memory cell array for relieving the defects is increased so that a semiconductor memory device capable of a high speed operation is obtained.

18 Claims, 14 Drawing Sheets

SEMICONDUCTOR MEMORY DEVICE HAVING A REDUNDANCY CAPABILITY

This is a continuation of application Ser. No. 08/100,202 filed Aug. 2, 1993, now abandoned; which is a continuation of application Ser. No. 07/585,239 filed Sep. 20, 1990, now abandoned.

BACKGROUND OF THE INVENTION

The present invention relates to a redundant memory device and a defective memory relief system.

As the degree of integration of MOS memories is increased, the reduction of yield due to defects during the production process becomes more and more problematic. The inclusion of even one defective memory cell damages the utility of the whole memory so that as the memory capacity increases the yield decreases.

In order to increase the yield of a memory, according to known technology, when there were defects in individual memory cells, the defective cells would be replaced with standby redundant memory cells which were separately provided as extra. Accordingly, the yield of a memory as a whole was increased.

As prior publications in connection with the above technology, for example, Laid-Open Japanese Patent Applications JP-A-57-74899 (1982) corresponding to U.S. Pat. No. 4,346,459, and JP-A-63-37900 (1988) are enumerated, which are hereby incorporated by reference.

A problem which exists in such conventional technology is that when the memory capacity is increased and the redundant memory cells are to be accessed, the access time is prolonged.

More specifically, in the conventional technology, for example, as shown in FIG. 1, the coincidence detection between a defective memory cell address and an input address was performed at once. In FIG. 1, numeral 1 is an address input buffer, 2 is an X series decoder, 4 is a memory cell array, 5 is a Y series decoder, 7 is a redundant memory cell array, 8 is an address decode signal, 9 is a defect address coincidence detection circuit, 10 is a Y series decoder for a redundant cell, 11 is an access suppression signal for an ordinary memory cell when a redundant memory cell is accessed, and 12 is a signal for accessing to a redundant memory cell. FIG. 1 illustrates a conceptual diagram only relating to the decoder among an entire memory constituted, other indispensable parts for the memory constitution such as a sensing amplifier and an output buffer are omitted for simplicity. The address buffer 1 has a function to form from an address signal (A), applied to the buffer from outside the memory, address decode signals 8 (each including a normal and an inverse (a, ā) address signal) which are necessary for the decoder processing inside the memory. In some constitutions of the decoder, a predecoder stage (the first stage of a logic decoder) is arranged in the address input buffer 1, and a signal after predecoding may be included in the address decode signal 8.

The function of the defect address coincidence detection circuit 9 is to compare addresses of defective memory cells programmed therein and address decode signals. The defect address coincidence detection circuit 9 has the combined function of a collation circuit and a column decode activation circuit which are illustrated, for example, in FIG. 1 and FIG. 5 of laid-open Japanese application JP-A-63-37900 (1988). Namely, as shown in FIG. 1 of the present invention, the address decoder signals are received from the address input buffer 1 and are checked as to whether the signals coincide with the defective memory address programmed beforehand. If coincidence is deleted, the access suppression signal 11 to the ordinary memory cell is activated so that the access to the ordinary memory cell is interrupted, the redundant memory access signal 12 is activated, and the access is changed over to the redundant memory cell. In particular, as the memory capacity is large-scaled and the number of input addresses increases, such problems arise in that, the logic of the two signals of the access suppression signal 11 and the redundant memory access signal 12 become complex which renders the high speed operation difficult.

Namely, when the memory capacity is enlarged, and the redundant memory is to be accessed, there arises such a problem that the access time is prolonged.

SUMMARY OF THE INVENTION

An object of the present invention is to provide a semiconductor memory device having redundancy means and a defective memory relief system which enable a high speed operation.

Features of the present invention which achieve the above object are to provide a memory device which comprises a memory mat formed by dividing a memory into a plurality of blocks, together with means disposed at every memory mat for generating access suppression signals at least to defect memory cells and for providing a defective memory relief system employing such means.

The above features and other features of the present invention will be further explained below.

The above means for generating access suppression signals is satisfactory when the circuit prepares access suppression signals only for the block of the memory mat assigned thereto, therefore only address signals for addressing within the block are needed for the means. Accordingly, the input line number to be processed in the means decreases and the access suppression (prohibition) signals can be input to a stage below the decoder so that the steps of logic operations decreases.

For this reason, the number of logic gate steps in the means decreases, their logic gates are simplified, and a high speed operation is enabled. Therefore, a semiconductor memory device and a defective memory relief system enabling a high speed operation is realized.

According to the present invention, an access speed to the redundant memory cell array is increased so that a semiconductor memory device capable of a high speed operation is obtained.

DESCRIPTION OF THE PREFERRED EMBODIMENTS

Embodiment 1

Figure 2:
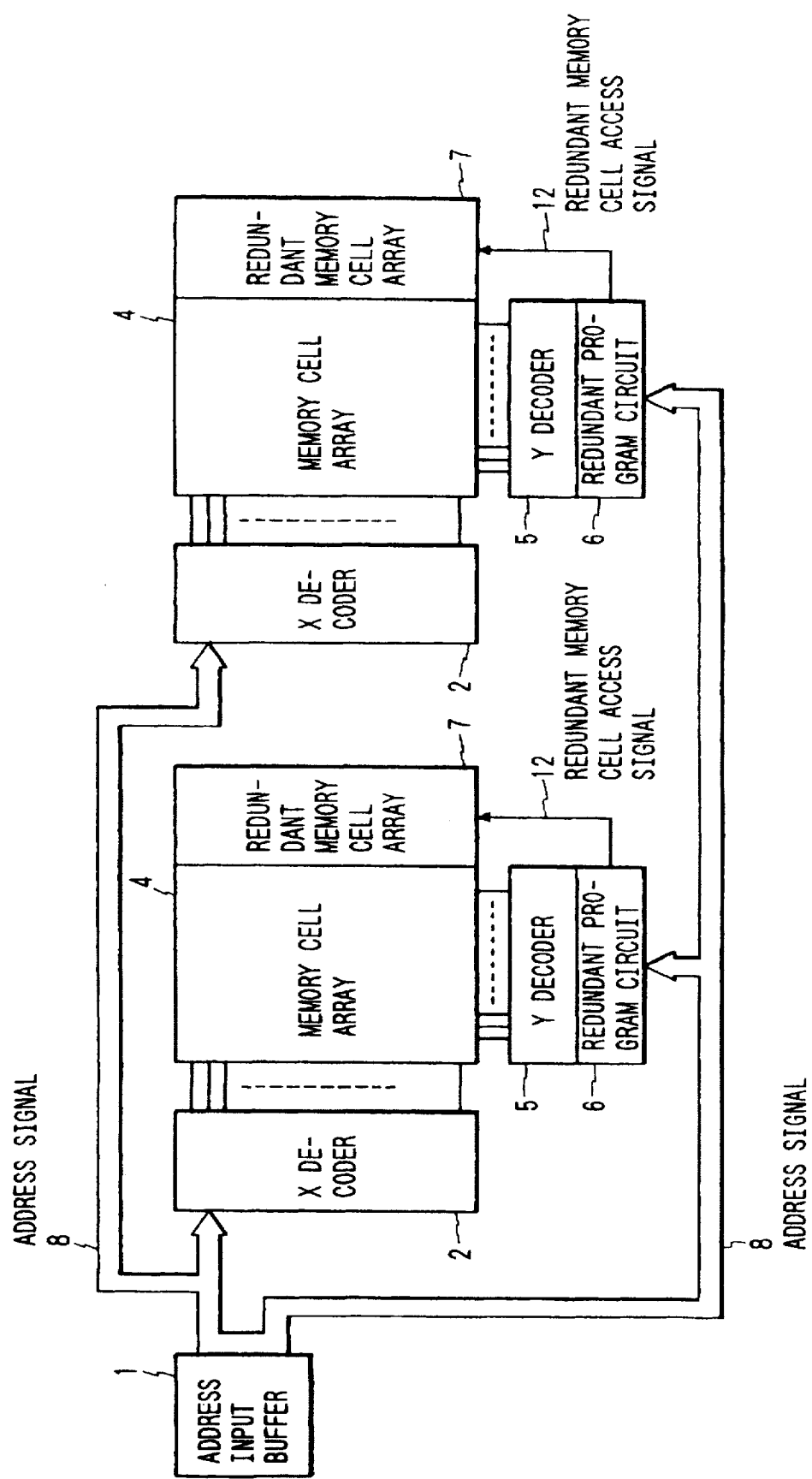
FIG. 2 is a diagram showing the constitution according to the first embodiment of the present invention.

Hereinbelow, one embodiment of the present invention is explained with reference to FIG. 2. FIG. 2 shows a part of a semiconductor memory device having redundancy means. In the present embodiment for simplifying the explanation, the portion of a memory array 4 is divided into two blocks (called memory mats). In a practical and popular large scale memory, this block number is increasing and presently reaches up to about 16 to 32. In the future it is considered that for such memory having multi bits and simultaneous output this dividing number will further increase from 32 to 64 or more than 72. The measures explained in connection with the embodiment of the present invention are generally applicable in the same manner even if the block dividing number increases.

In FIG. 2, an address signal 8 output from an address buffer 1 designates an address of a predetermined bit (memory cell) in a memory mat (the memory cell array 4) of each block, and is input to a redundant program circuit 6 (in which the position of defective memory cells is programmed) provided at prestages of an X decoder 2 and a Y decoder 6. When an address of a defective memory cell is input, a defective memory access suppression signal is input to the Y decoder 5 from the redundant program circuit 6 (may be input both to the X decoder 2 and the Y decoder 5). Thereby, an access to the column or bit in which there exists a defective memory cell is suppressed. Further, the redundant program circuit generates a redundant memory cell array access signal 12 for selecting a redundant memory cell array 7 and thereby relieves the defective memory.

Figure 1:
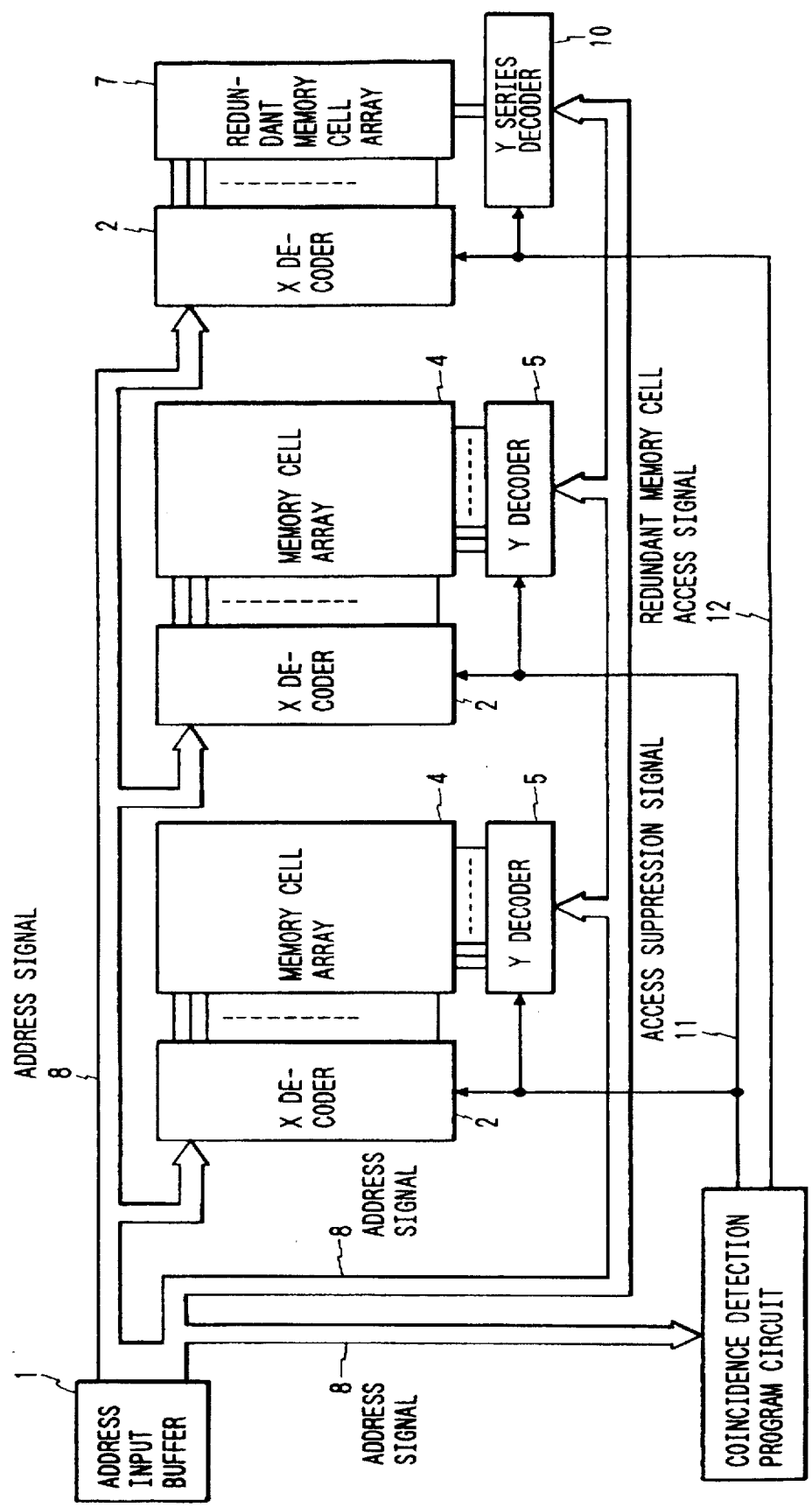
FIG. 1 is a diagram showing the constitution of a prior art arrangement.
Figure 12A:
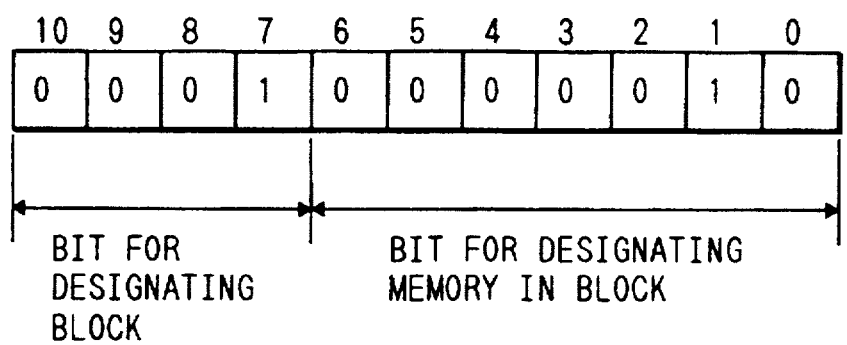
FIGS. 12(a) and 12(b) are diagrams showing examples of address information.
Figure 12B:
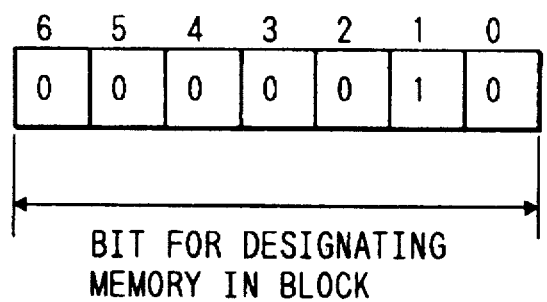

A feature of the embodiment shown in FIG. 2 is that the program circuit for defect detection 6 is provided at every block. The coincidence detection program circuit 9 as shown in FIG. 1 uses all of the higher level bit information of the Y series address information as shown in FIG. 12(a). In contrast, the redundant program circuit 6 of the present embodiment addresses only within its own block, and among address information, the bit information in charge of the selection of block is eliminated, because such information is provided by the information as to which mat of the redundant program circuit is being activated. Namely, as shown in FIG. 12(b), the bit number of the address information decreases, and the number of logic operation steps for signal processing also decreases. This leads to a high speed operation.

In the present embodiment as well, the address signal 8 is an output from the address buffer 1, and contains a positive and a negative signal a, $\bar{a}$. The address buffer 1 may include a predecode stage (the first stage of decoder) and, in this instance, the address signal 8 contains a predecoded address signal.

Figure 3:
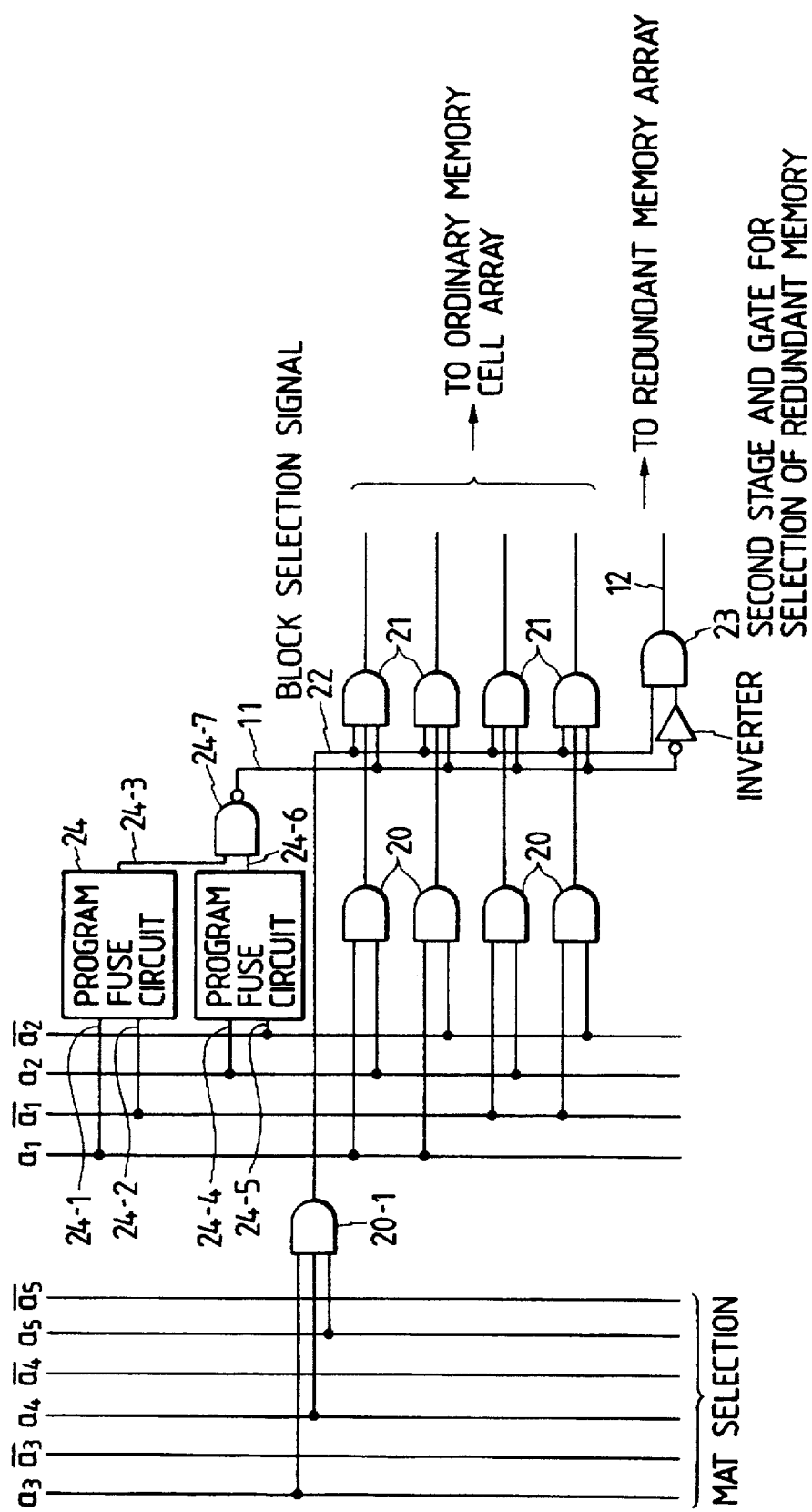
FIG. 3 is a diagram showing details of the program circuit portion according to the present invention.

FIG. 3 shows the logic constitution of the portions of the Y decoder 5 and the redundant program circuit 6 in FIG. 2. In this example, the width (column number) in the Y direction of the memory cell array is determined to be 4 bits. For the case where the width in the Y direction is broader, such as in an actual memory, the explanation of the present embodiment is applicable in substantially the same way.

Actually, the column number in the Y direction of the memory cell array is from 16 to 256, or sometimes more. For example, when the column number in the Y direction is 128, 7 bit information is necessary for selecting one line among 128 lines, and 14 signals $a_1$, $\bar{a}_1$, $a_2$, $\bar{a}_2$, $a_3$, $\bar{a}_3$, $a_4$, $\bar{a}_4$, $a_5$, $\bar{a}_5$, $a_6$, $\bar{a}_6$, $a_7$, $\bar{a}_7$ are input.

The address signals consist of positive and negative signals (or complementary logic signals) which are decoded by an AND gate 20 of the first stage and by an AND gate 21 of the second stage. The block selection signal 22 is a signal indicating the selection of this block. An AND gate 20-1 is a gate for generating the block selection signal 22 and is provided in one-to-one correspondence to the respective blocks. Namely, 2 bit information $a_1$, $a_2$ in FIG. 3 indicates an address inside the block (since the width in the Y direction is 2 bits, such is expressed by 2 bits), while the 3 bits $a_3$, $a_4$ and $a_5$ pertains to information for selecting one among a plurality of blocks (herein $2^3=8$).

It is sufficient that a program fuse circuit 24 contain only address information within the block being programmed so that the input line number is decreased. The information as to which block (memory mat) was selected is obtained by fetching the block (mat) selection signal 22 of $a_3$, $a_4$, $a_5$ ($\bar{a}_3$, $\bar{a}_4$, $\bar{a}_5$).

Numeral 24 indicates the program fuse circuit. The function of the circuit is to connect one of two input terminals 24-1 and 24-2 which come from the left with the output terminal 24-3 in the right side by the program. This ordinarily includes an element which enables cutting with a laser, and, depending on the cutting manner, this is programmed as to which of the terminals at the left side is to be connected to the terminal at the right side or that both are not to be connected. Such a program is executed after the first operating test of the memory. If the number of the defective memories is less than the relievable defect number, appropriate fuses are cut by the laser after the test, and such a program is prepared so that, without accessing to the defective memory cell, the redundant memory cell is to be accessed. In the present embodiment, the redundant (standby) memory cell access signal 12 is constituted through a logical AND of a logical NOT of the defective memory cell access suppression signal 11, and of the block selection signal, and the AND gate 23 is the second stage AND gate for selection of the redundant memory.

A specific defective memory relieving method is explained below. Let it be assumed that such a defect is included on the uppermost column in the ordinary memory cell array of FIG. 3. This column is selected when the address signal $a_1$ is high and $a_2$ is also high. Generally, for relieving defective memory cells, (1) access prohibition to the defective memory cell, and (2) access execution to the redundant memory cell in the standby memory cell array, are required to be performed. In this embodiment, the defective memory cell access suppression signal 11 serves for these two functions. At first, by properly programming the program fuse circuit 24, the signal terminals 24-1 with 24-3 and 24-4 with 24-6 are connected. Thereby, the defective memory cell access suppression signal 11 is rendered low only when both $a_1$, and $a_2$ are rendered high. The signal 11 is input to the AND gate 21 which couples to the ordinary memory cell array, and prohibits access to the ordinary memory cell array only when the defective column is selected. Further, with the inverse signal of the defective memory cell access suppression signal 11, the signal 12 is rendered high and selection of the redundant memory is executed.

Further, in the present embodiment, although the redundant memory cell array includes only one column, when the column number is increased to more than two, fundamentally the same logical construction is possible. Namely, it is sufficient to select one among a plurality of redundant memory cell arrays by using the other address decode signal 8.

Still further, a plurality of redundant memory array columns can be associated with a plurality of defects in the block so as to correspond to each other. In this instance, even when there are defects over a plurality of columns in the block, the relief of the memory is enabled.

Figure 4:
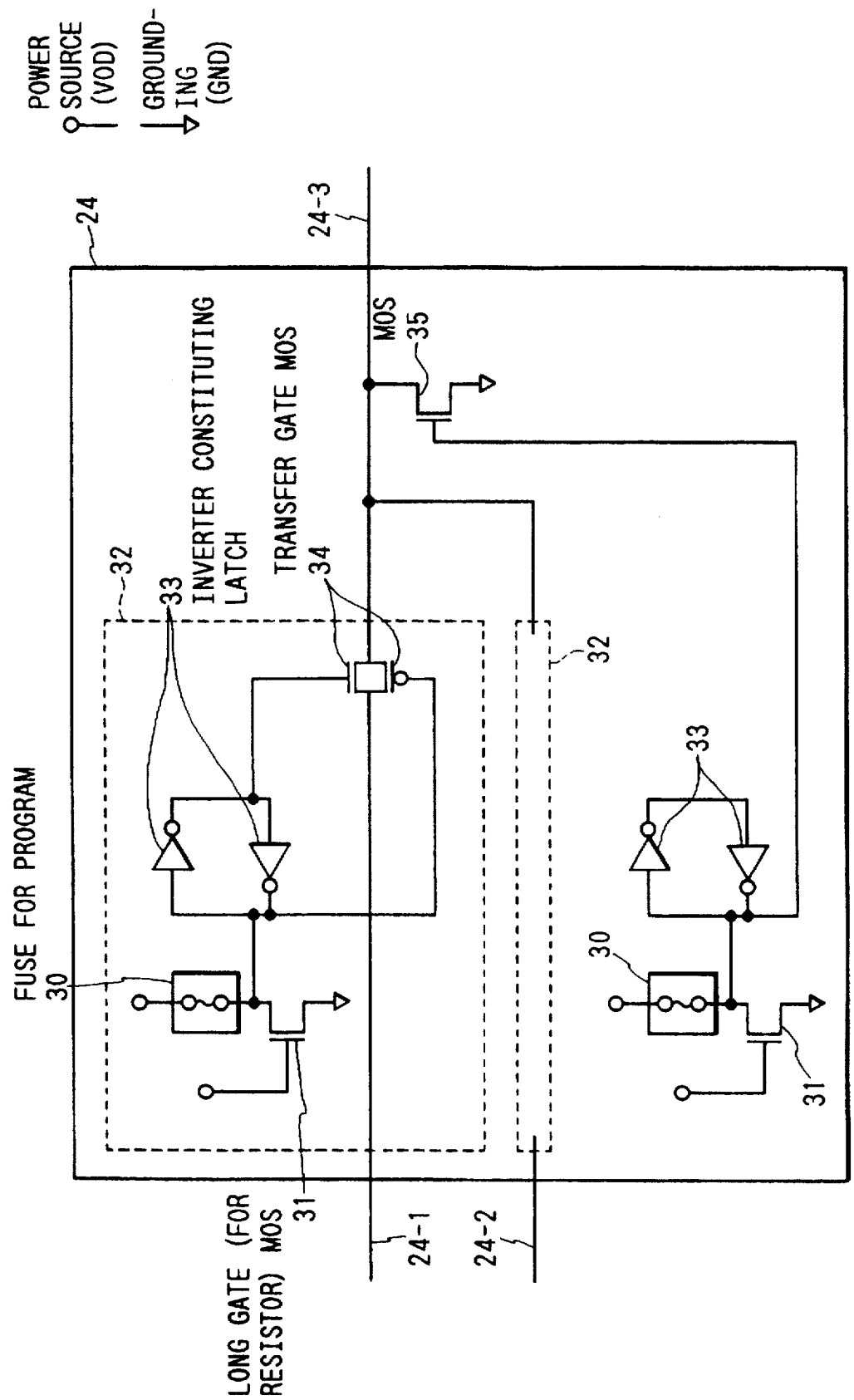
FIG. 4 is a diagram showing details of the fuse circuit portion.

The detailed constitution of a program fuse circuit 24 is shown in FIG. 4. The program fuse circuit 24 corresponds to the same circuit in FIG. 3. Hereinbelow, the operation thereof is explained. A program fuse 30 is a portion which can be cut after the formation of the element with a laser, etc. If this fuse is not cut, the resistance thereof is much lower than that of a long gate MOS 31 at the ground side, and the node therebetween can be fixed to the VCC side. This information is stably stored by a latch circuit constituted by using an inverter circuit 33. No fuses in the block 24 before being cut apply a voltage to turn on the NMOS and PMOS transistors of a complementary MOS transfer gate 34. VCC is applied to the gate terminal of a MOS transistor 35, and the MOS transistor 35 is turned on based upon the same logic as above. Accordingly, the right side terminal of the block 24 is short-circuited to ground.

For example, when the upper left terminal 24-1 of the block 24 is required to be connected to the right terminal 24-3, such is realized by cutting the fuse 30 which controls the MOS transistor 35 and the fuse 30 which controls the transfer gate coupled to the upper left terminal.

In the example of FIG. 4, since the number of input terminals is only two lines, it is sufficient to prepare two blocks 32. In general, when the number of input terminals is increased, the number of the blocks is simply increased accordingly, and one line therein can be short-circuited to the right side terminal. Namely, the number of blocks is the same as the line number of the input terminals (for example, 24-1, 24-2).

Further, the present embodiment is applicable to both a memory in which the output from the output buffer is a 1 bit output, and a memory in which the output is a multi bit and simultaneous output.

In case of the multi bit and simultaneous output, such constitution is possible that each block corresponds to one output. In this instance, each block includes respectively an independent sense amplifier and a write amplifier. Further, an X decoder 2 is common to memory blocks located at right and left sides thereof. A constitution in which a plurality of outputs are led out from one memory cell block is also possible, and, in this instance, it is sufficient to locate a plurality of sense amplifiers and a plurality of write amplifiers within one block.

The former which outputs the multi bit output by dividing into a plurality of memory blocks is possible to turn on all of the word lines of the memory blocks used for the simultaneous output, namely, such is suitable when restriction on the power consumption is not so severe. In this case, the logic operation of the X series decoder is simplified, and it is suitable for a further high speed operation.

The latter which outputs the multi bit from one memory block is suitable for the following applications. Namely, in case the restriction of power consumption in a memory is very severe, and a memory cell holding current becomes too large when word lines are turned on over a plurality of blocks, such method should be employed that the multi bit is to be output from one memory block.

Embodiment 2

The second embodiment of the present invention is explained with reference to FIG. 5.

The portion of which the present embodiment differs from the first embodiment is that the redundant memory cell array 7 is not distributed all over the memory cell blocks but concentrated at one or a predetermined plurality of memory blocks (less than all of the blocks).

Figure 5:
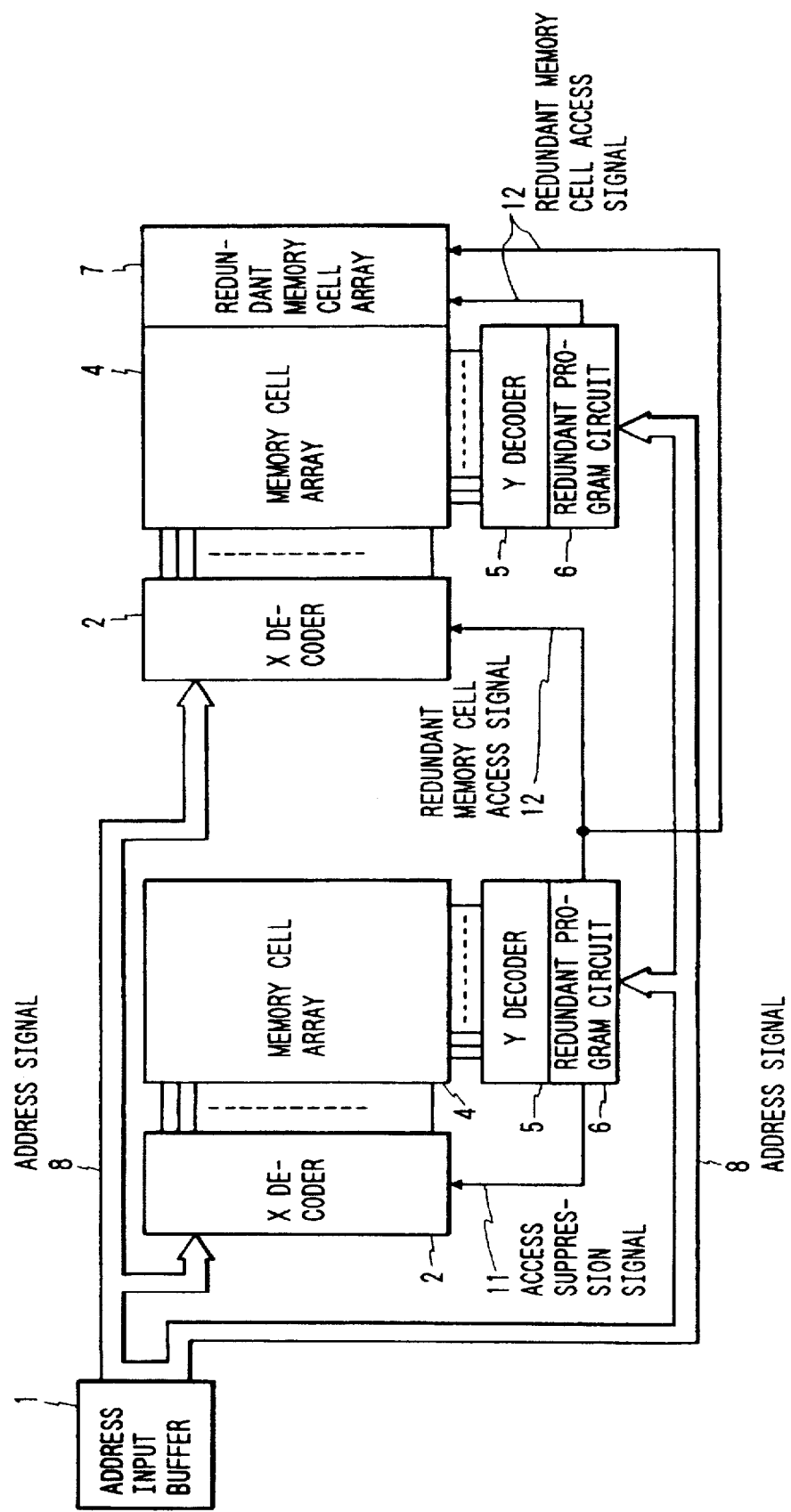
FIG. 5 is a diagram showing the constitution of the second embodiment according to the present invention.

The memory cell block at the left-hand side in FIG. 5 containing no redundant memory cell arrays is called an ordinary block. The memory block at the right-hand side, that is, the block containing the redundant memory cell array, is called a redundant block.

When a defective memory cell is included in the ordinary memory cell block, such is detected by the redundant program circuit 6 of the ordinary block, and an access to the ordinary block is prohibited by the defective memory cell access suppression signal 11. Concurrently, for accessing to the memory of the redundant block, the redundant memory cell access signal 12 is generated.

According to the present embodiment, the redundant memory cell arrays 7 need not be included in all of the memory blocks, the area occupied by the redundant memory cell array is decreased, and an area for the ordinary memory cell arrays is possibly increased.

Embodiment 3

Another embodiment of the present invention is explained with reference to FIG. 6. In the present embodiment, like Embodiment 2, the redundant memory array 7 is not included in an ordinary memory block 602, but is included in a redundant memory block 601. However, the portion which differs from Embodiment 2 is that a redundant memory selection program circuit 72 for selecting the redundant memory cell array is provided separate from a program block 71 generating the memory access prohibition signal 11.

The advantages of this constitution are as follows. Namely, in particular, when the number of the divided blocks of the memory cell array increases, the logic circuitry required for selecting the redundant memory cell arrays 7 does not become complex. And with the constitution of the present embodiment, the program circuit 72 is easily located near the redundant memory cell array being driven so that the desired high speed operation is enabled.

In the present embodiment too, more than two ordinary memory blocks and more than two redundant memory blocks may also exist.

Further, the redundant memory cell array 7 is not limited to include only one column, but may include a plurality of columns. At that moment, the redundant memory selection program circuit 72 is allowed to use low level bit information in the address decode signals 8, as shown in FIG. 6. A plurality of columns in the redundant memory cell array 7 can easily correspond to a plurality of defective bit addresses in the memory cell array 4, and at that time relief of a plurality of defects is enabled.

Embodiment 4

Figure 7:
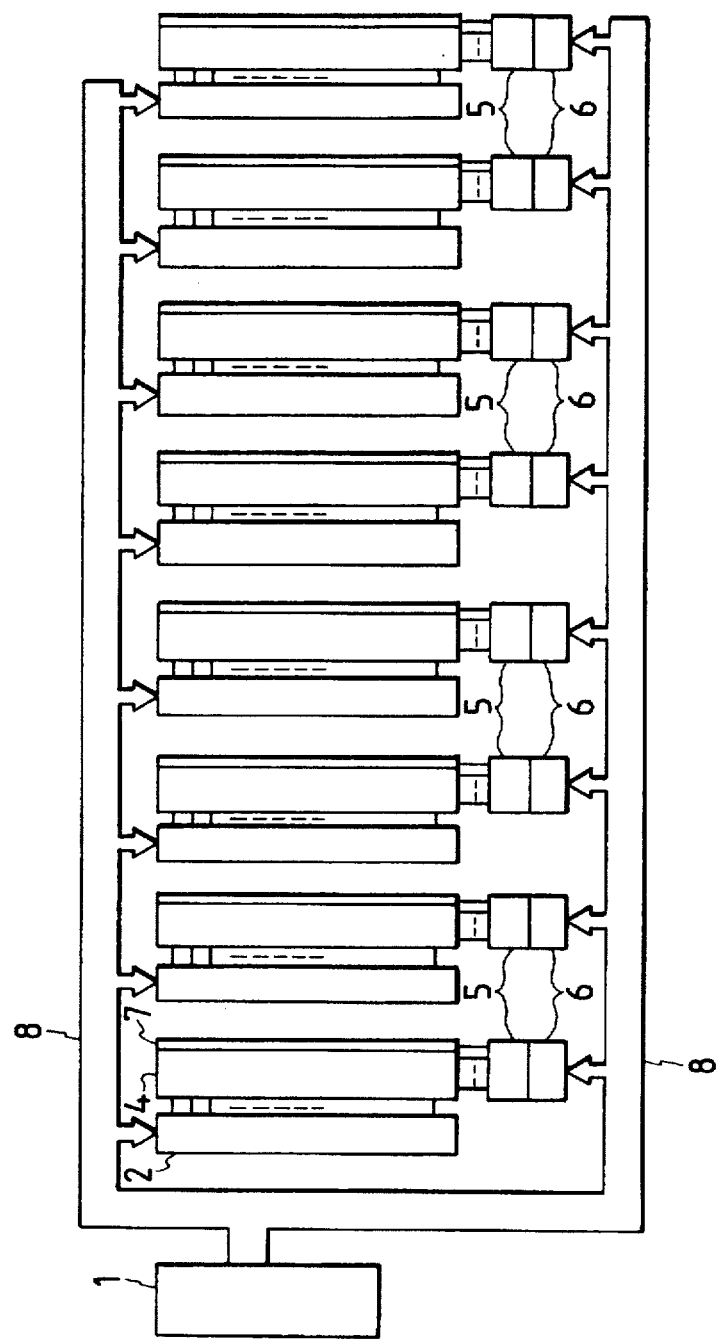
FIG. 7 is a diagram showing the constitution of the fourth embodiment according to the present invention.

FIG. 7 shows an exemplary constitution of the memory cell array 7, and its direct peripheral circuits X decoder 2, Y decoder 5 and redundant program circuit 6 which is divided into 8 blocks.

When the respective blocks are corresponded to 1 bit input and output, each block necessitates at least one set of a sense amplifier and a write amplifier (not shown), however, at the same time, 8 bit input and output is enable.

Columns containing defective memory cells in the memory cell array 4 of respective blocks are replaced by the redundant memory cell array 7 in each block and are relieved.

Further, the respective blocks can be corresponded to 2 bit inputs and outputs, and in this instance, each block is required to have at least two sets of a sense amplifier and a write amplifier. At this time, in the case of FIG. 7, inputs or outputs of 16 (2×8) bits in total are effected simultaneously. Further, at this time too, it is sufficient that the relief of the columns containing defective memory cells is performed by every block at the redundant cell array provided within the block.

In the present embodiment, the input and output of each block is not limited to 1 bit or 2 bits, and even if the input and output are modified into a multi bit the same effect is obtained.

When the X series (word line) turns on sub-word lines in the portion necessary for input and output in the block, the power consumption is further saved. In this instance, Y series address information can also be supplied to the X series decoder.

According to the present embodiment, in a memory having the multi bit input and output constitution, the redundant program circuit and the redundant memory cell array 7 are provided at every block so that a high speed memory device (redundant memory device) with redundancy is realized.

Embodiment 5

FIG. 8 shows an exemplary constitution of a decoder which enables a high speed operation even with a large fan-out.

Figure 8A:
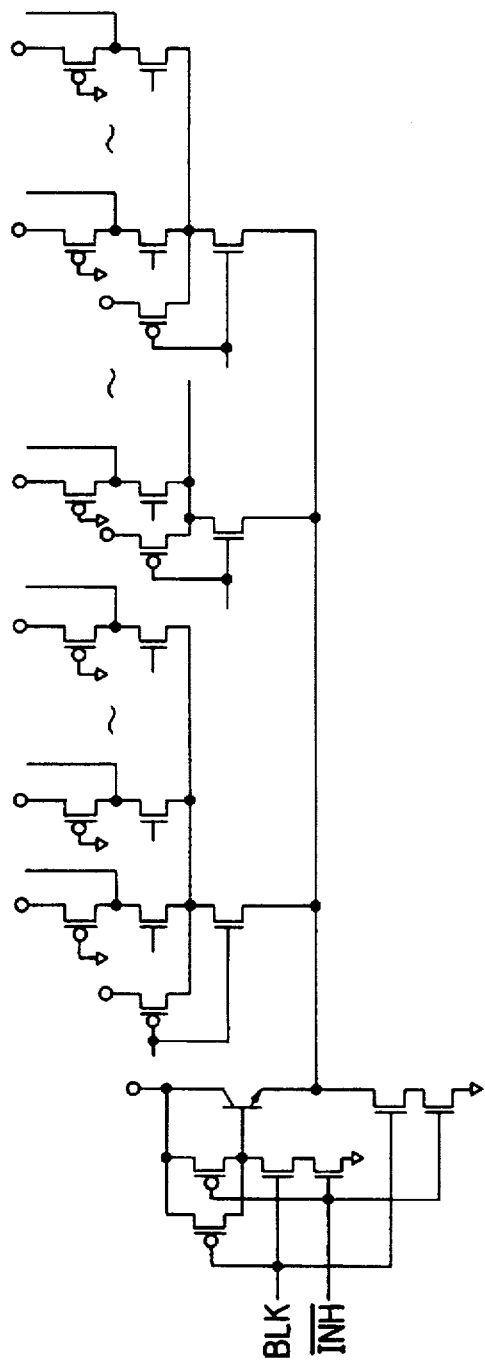
FIGS. 8(a) and 8(b) are diagrams showing the constitution of the fifth embodiment according to the present invention.
Figure 8B:
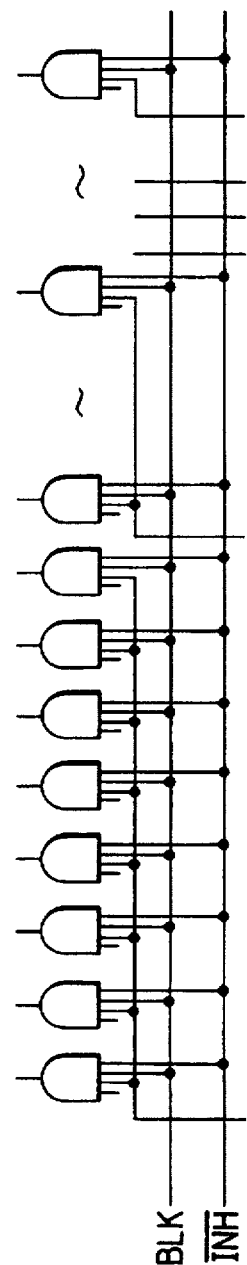

In NAND gates arranged in parallel in multiple number, when the signals (for example, BLk, INH) are inputted, in common, the logical fan-out number greatly increases when viewed from its driving gate. This has an adverse effect to the high speed operation of the gates. Therefore, the features of the present decoder logic gate are as shown in FIG. 8(a) that the input of the common input terminals is received by a plurality of elements such as MOS devices to reduce the load of the driving gate. The logical constitution of this is shown in FIG. 8(b).

With the present embodiment, even when the input fan-out is large, parallel NAND gates which operate at a high speed are obtained.

The decoder according to the embodiment of FIG. 8 enables operating at a high speed even in the instance such as Embodiment 2 (the instance when the fan-out is large, such as the decoder 2 to which the access suppression signal 11 is input).

Embodiment 6

The difference between the redundant decoder according to the present invention and the redundant decoder according to the conventional art is explained with reference to FIGS. 9(a) to 9(b).

Figure 9A:
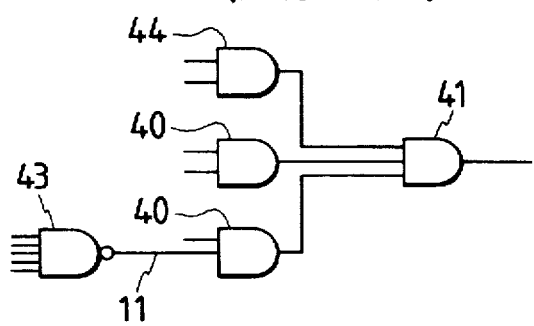
FIGS. 9(a) to 9(d) show diagrams of a conventional decoder circuit and a decoder circuit according to the present invention.
Figure 9B:
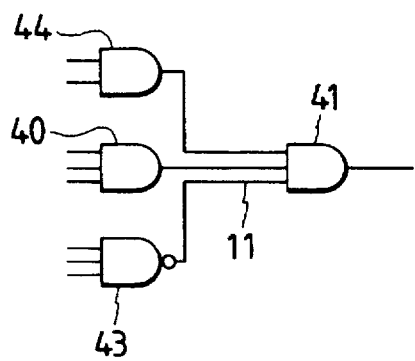
Figure 9C:
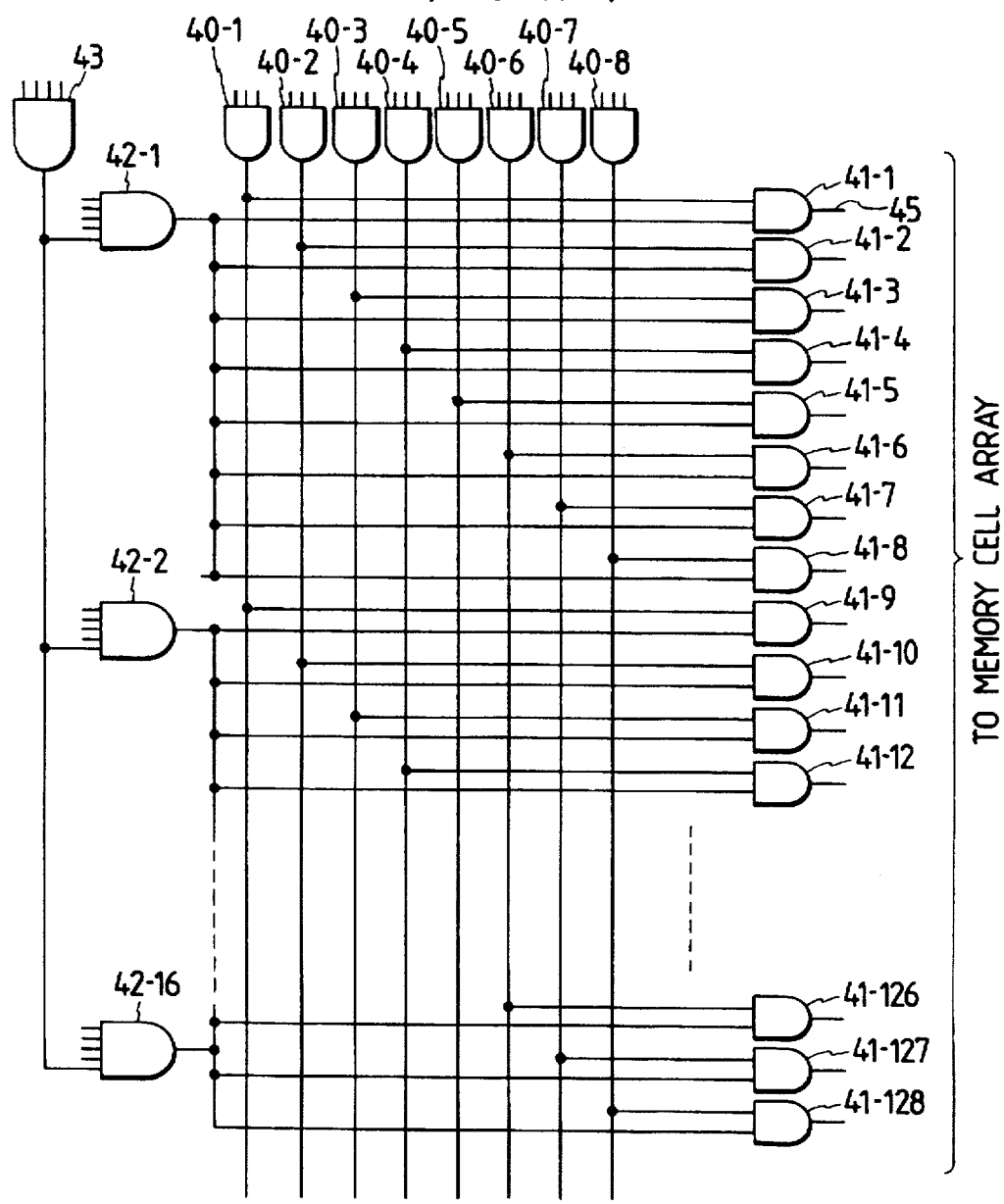
Figure 9D:
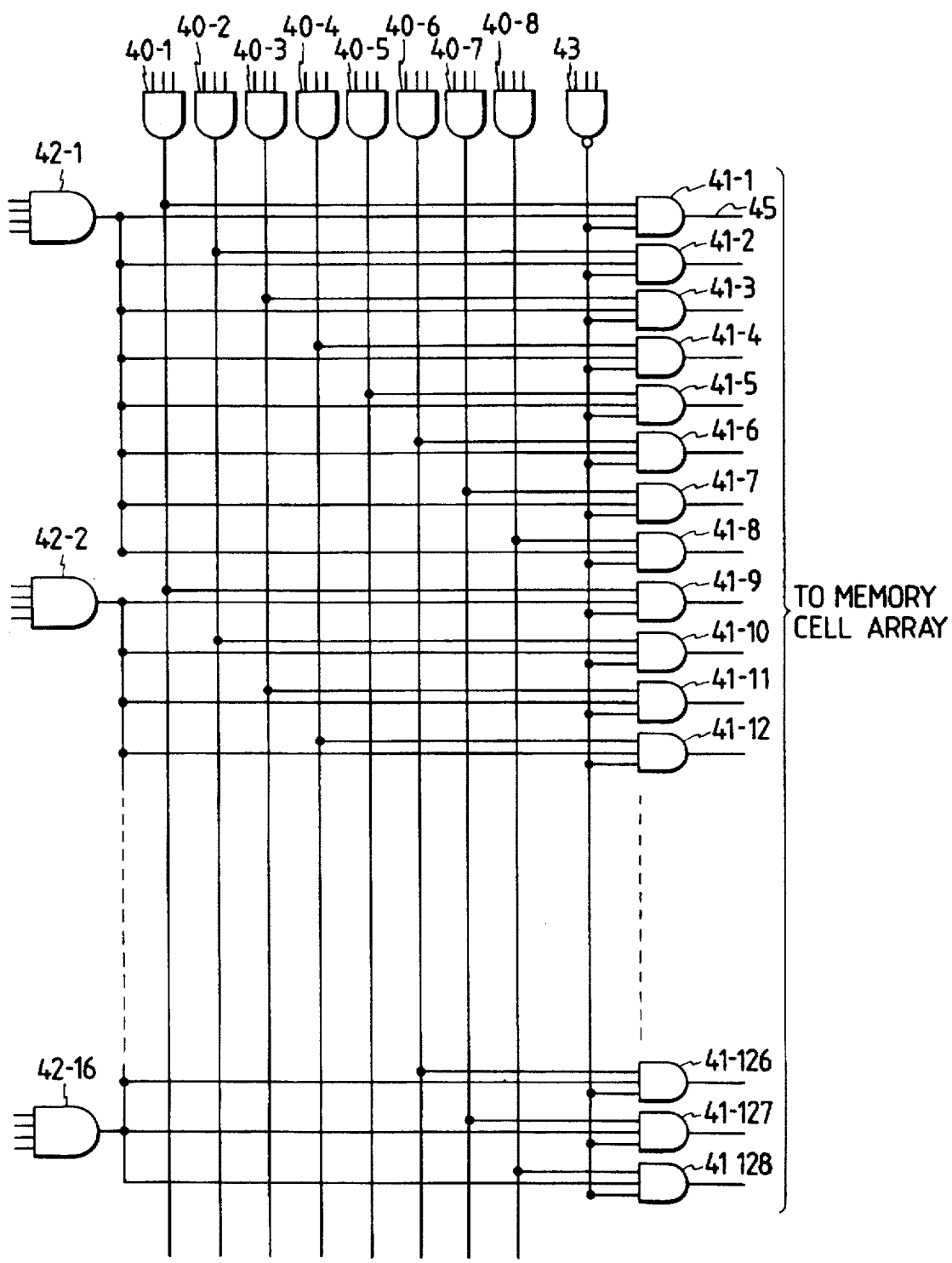

FIGS. 9(a) and 9(c) show exemplary constitutions of the redundant memory decoder according to the conventional art, and FIGS. 9(b) and 9(d) show the exemplary constitutions of the redundant memory decoder according to the present embodiment.

Both FIGS. 9(a) and 9(c), and FIGS. 9(b) and 9(d) indicate column decoders. With 7 bit information, one column is selected among 128 columns.

The outputs of 8 AND gates 40 and 16 AND gates 42 are connected to the inputs of 128 AND gates 41. The output signal of the AND gate 41 is directed to the memory cell array and selects one line among the memory cell column. Numeral 43 is a NAND gate (which corresponds to the NAND gate 24-7 in FIG. 3) for generating the access suppression signal. However, in the instance of FIGS. 9(a) and 9(c) the output signal of gate 43 is input to the AND gate 42 which is the first stage gate of the decoder, whereas, in the instance of FIGS. 9(b) and 9(d), it is input to the AND gate 41 which is the second stage gate of the decoder. An AND gate 44 is a gate for selecting a memory block and, in case of a 2 bit input, is applicable to the constitution of $2^2$ blocks—4 blocks.

When a redundant memory cell is accessed, an access to a defective memory cell is suppressed. Therefore, it is necessary to lower the output of the NAND gate 43. However, in the instance of the conventional art shown in FIGS. 9(a) and 9(c) since the NAND gate 43 and the AND gate 42 are connected in series, the delay time of the NAND gate 43 is added to the delay time of the AND gate 42 and AND gate 41, and a total delay time increases accordingly. However, in the instance of FIGS. 9(b) and 9(d), the NAND gate 43 is connected in parallel to the AND gate 42, the delay time of the NAND gate does not increase the total delay time.

Accordingly, the present constitution enables a high speed operation of the memory access.

Embodiment 7

Figure 10:
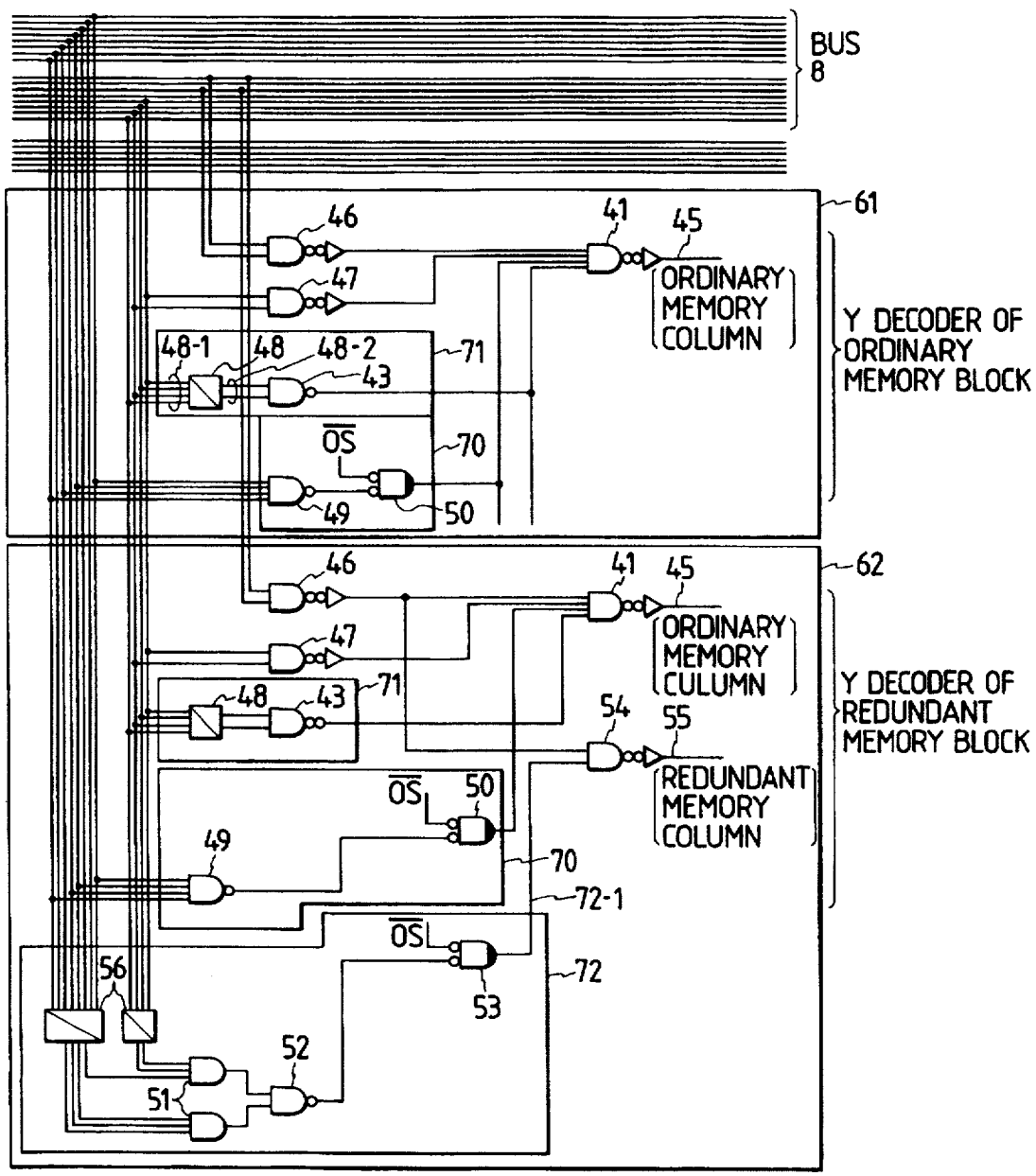
FIG. 10 is a specific constitutional diagram of the periphery circuit in FIG. 6.

FIG. 10 is the exemplary constitution of a column decoder in which only a part of the memory blocks include the redundant memory cells (in that, the redundant memory cells are not necessarily included in all of the blocks). Namely, the drawing is a diagram showing the constitution of the Y decoder 5, the redundant program circuit for providing an access suppression signal (collation circuit) 71 and the redundant memory selection program circuit 72 in FIG. 6.

In the present drawing, the memory block is divided into 16, and one among 16 blocks is selected. This selection is carried out by a NAND gate 49 and NOR gate 50. Namely, 4 bit information input into the NAND gate 49 determines which is to be selected among 16 memory blocks. A circuit block 70 consisting of the NAND gate 49 and the NOR gate 50 is provided in one-to-one correspondence at every memory block. Only the outputs of the circuit blocks 70 included in the selected memory blocks are rendered "H" and transmitted to the second stage decoder 41.

Figure 6:
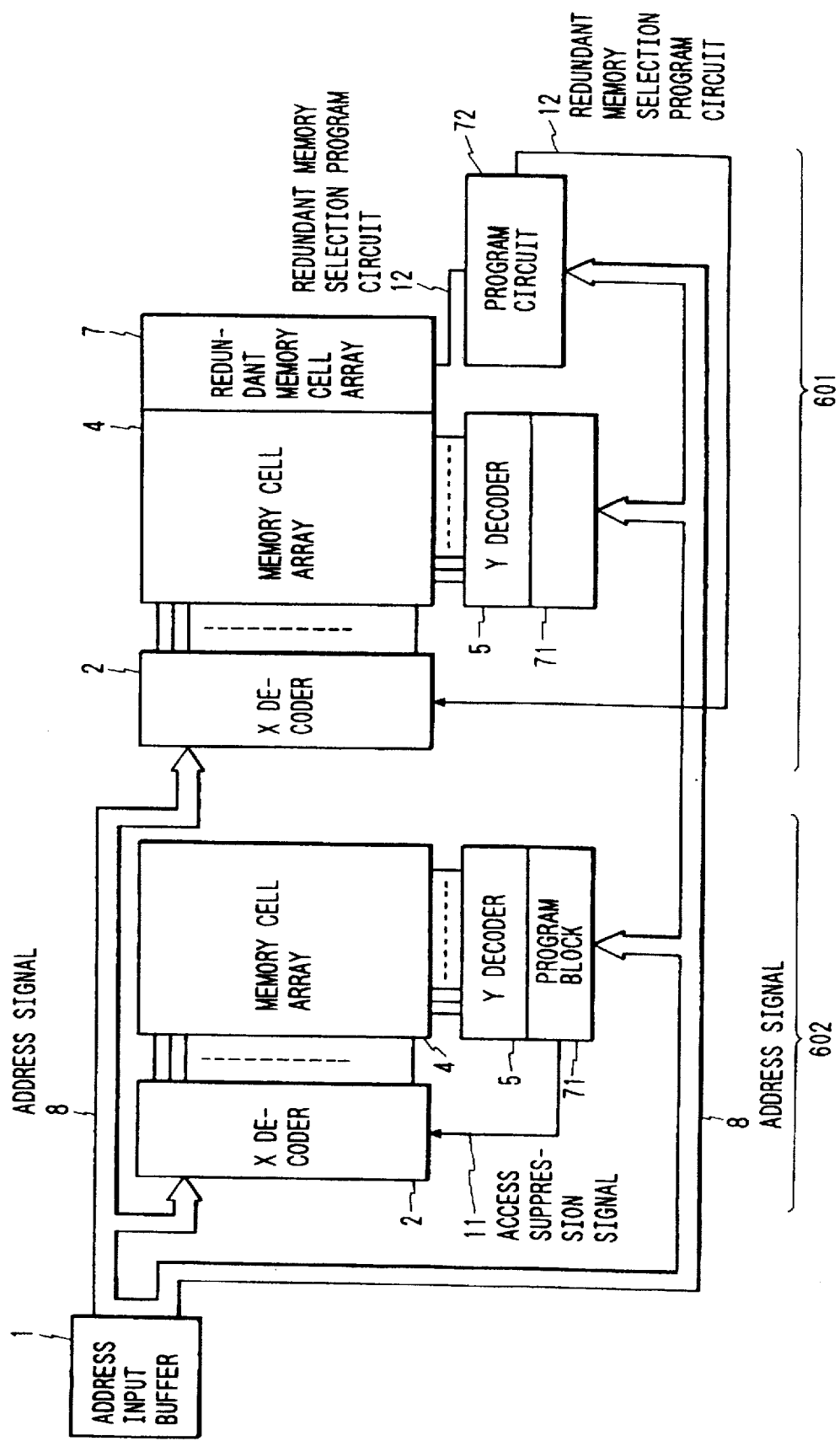
FIG. 6 is a diagram showing the constitution of the third embodiment according to the present invention.

As shown in FIG. 6, the memory block containing the redundant memory cell array 7 in addition to the ordinary memory cell array 4 is called a "redundant memory block 601", and the memory block containing no redundant memory but only containing the ordinary memory cell array is called an "ordinary memory block 602".

Numeral 61 in FIG. 10 is a circuit block showing a constitution of the ordinary memory block 602 and the Y decoders therein, and numeral 62 is a circuit block showing a constitution of the Y decoders in the redundant memory block 601.

Numeral 71 is a block of the access prohibition signal generation circuit (the defect address collation circuit) for prohibiting access to the defective memory cell. The circuit block 71, like the circuit block 70, is provided in one-to-one correspondence at every memory block (601 and 602 in FIG. 6). When the address of a defective memory cell is input to circuit block 71, the output is rendered "L" so that the circuit functions to render the ordinary memory cell in the memory block non-selective.

Numeral 48 is a program element, and enables programming corresponding to the position of defective memory cells by changing the interconnection relationship between the 4 left inputs 48-1 and the right input 48-2. The program element 48 is realized by the program fuse circuit shown in FIG. 4.

Numeral 72 corresponds to the redundant memory selection program circuit 72 shown in FIG. 6, and is contained only in the redundant memory block 601. This circuit can also be referred to as the redundant memory cell selection signal generation circuit (defect address collation circuit). The redundant memory cell selection signal generation circuit 72 is also provided in one-to-one correspondence for every redundant memory block 601. The function of the redundant memory cell selection signal generation circuit 72 determines whether an input address is one of the addresses of defective memory cells, and when it is one of the addresses of the defective memory cells, the output 72-1 of the redundant memory cell selection signal generation circuit 72 is rendered "H", and is input to the AND gate 54 for selection of a redundant memory cell. In the AND gate for selection of the redundant memory cell, the output of the first stage AND gate 46 and the output 72-1 are operated in AND. When the AND thereof is "H", the redundant memory cell selection signal line 55 is activated, and as the result, a redundant memory column is selected.

A different point between the redundant memory cell selection signal generation circuit 72 and the access prohibition signal generation circuit 71 is their difference in outputs "H" and "L", in that the output of the redundant memory cell selection signal generation circuit is rendered "H" when a defective memory address is input, wherein the output of the access prohibition signal generation circuit 71 is rendered "L" when a defective memory address is input.

A second different point between the access prohibition signal generation circuit 71 and the redundant memory cell selection signal generation circuit 72 is the amount of information required at their inputs. Since the access prohibition signal generation circuits 71 are provided at every memory block, it is sufficient for designation of its address to input only the address information (shown in FIG. 12(b)) within the memory blocks. However, the redundant memory cell selection signal generation circuits 72 are not necessarily provided at every memory mat. Therefore, information as to which memory block the defective cell to be replaced by a redundant memory cell is contained in is required to be input. Namely, the information shown in FIG. 12(a) has to be input.

Further, in the present exemplary constitution, since the access suppression signal generation gate 43 operates in parallel with the other logic gates 46 and 47, such advantage is obtained that the delay time of the access suppression signal generation circuit does not lead to a total delay time increase.

Figure 11:
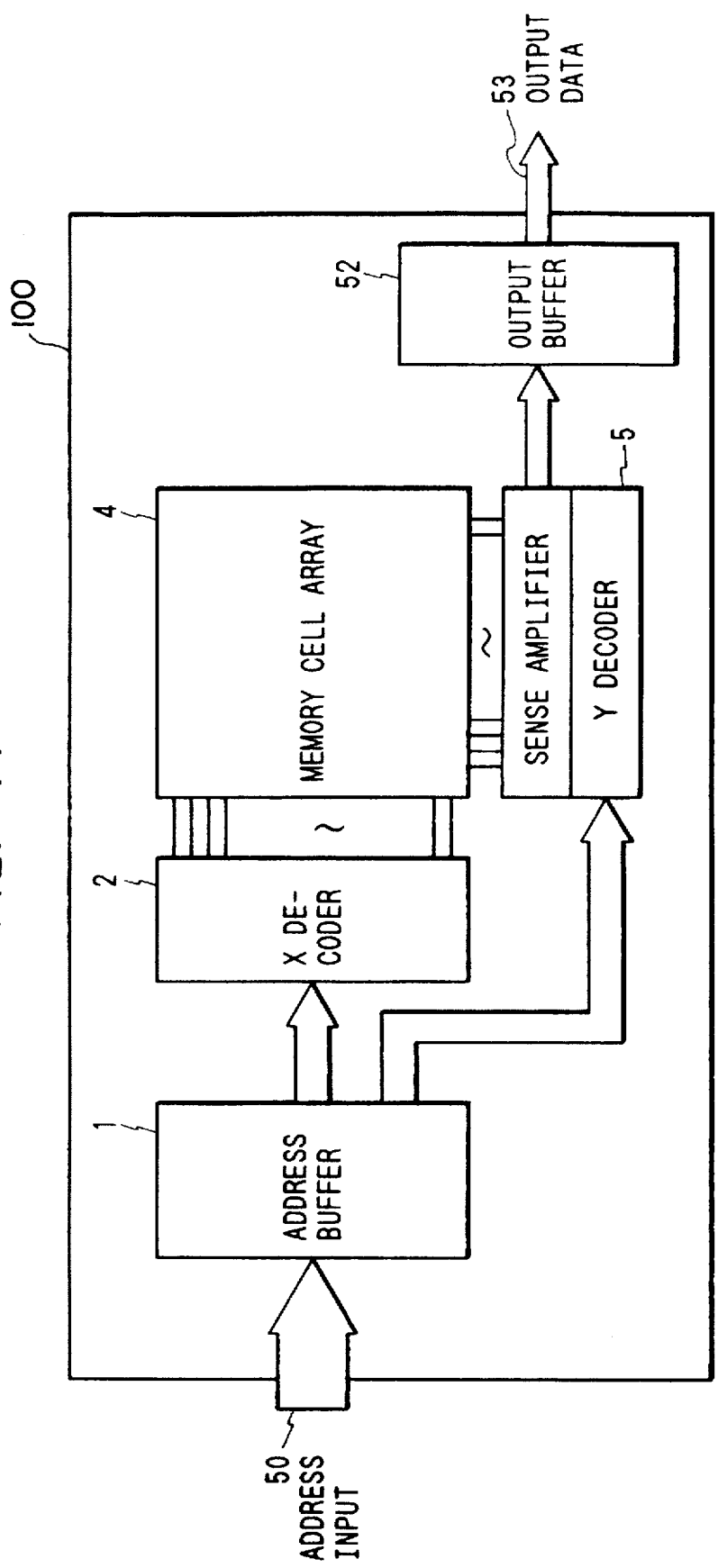
FIG. 11 is a schematic overview constitutional diagram of a general memory device.

FIG. 11 is a view for explaining the entire memory device. The address buffer 1 converts the address input 50 inputted into an address signal and transmits to the X decoder 2 and Y decoder 5. Based on the address signal inputted, a word line is selected by the X decoder 2, and a data line is selected by the Y decoder 5, thereby a predetermined memory cell in the memory cell array is selected which is transmitted to the output buffer 52 through the sense amplifier and is outputted as an output data 53.

By applying the constitution of the embodiment according to the present invention as explained above for this memory device, a redundant memory device capable of a high speed operation is obtained.

The redundant memory device and the system for the redundant memory device are applicable not only to the separate semiconductor memory device such as chip 100 in FIG. 11 but also, for example, to a microprocessor including a central processing unit (CPU) and a semiconductor memory device which necessitates defect relief.

It is to be understood that the above-described arrangements are simply illustrative of the application of the principles of this invention. Numerous other arrangements may be readily devised by those skilled in the art which embody the principles of the invention and fall within its spirit and scope.

What is claimed is:

1. A defect relief semiconductor memory device comprising:
    a memory having a memory array constituted by a plurality of memory mats, in which data can be written thereinto and read therefrom, and at least one standby memory cell array,
    wherein said memory is divided into a plurality of memory blocks, each one of said at least one standby memory cell array being associated with a respective one or more of the memory blocks, and each of said plurality of memory blocks including a memory mat, a separate address circuit for accessing memory cells of that memory block, a circuit for generating an access prohibition signal when a defective memory cell in that memory block is accessed and another circuit for selecting that one of said at least one standby memory cell array associated therewith when said defective memory cell is accessed by the address circuit of that memory block, and
    wherein the number of address bits for designating a defective memory cell in a memory block having the defective memory cell to be accessed by said access prohibition signal is smaller than the number of address bits required for designating a memory cell of said memory array on said device as a whole.

2. A defect relief semiconductor memory device according to claim 1, wherein each memory mat constitutes a separate memory cell array.

3. A defect relief semiconductor memory device according to claim 1, wherein each memory mat consists of a block of memory cells constituting one or more columns of memory cells.

4. A direct relief semiconductor memory device according to claim 1, wherein said at least one standby memory cell array includes a plurality of standby memory cell arrays, each one thereof is provided at a respective one of said plurality of memory blocks.

5. A defect relief semiconductor memory device according to claim 4, wherein each memory mat constitutes a separate memory cell array.

6. A defect relief semiconductor memory device according to claim 4, wherein each memory mat consists of a block of memory cells constituting one or more columns of memory cells.

7. A semiconductor memory device having a redundancy memory system comprising a circuit for supplying address signals; an addressing circuit for decoding one of row address signals and column address signals; and a plurality of separate memory blocks, each of said memory blocks including:

a memory cell array, a standby memory cell array, a circuit for generating an access prohibition signal when a defective memory cell in a corresponding memory cell array is accessed by the address signals from the address signal supplying circuit and supplying the access prohibition signal to said corresponding memory cell array, the number of address bits decoded for generating said access prohibition signal of said corresponding memory cell array is smaller than that of the total number of address bits decoded by said addressing circuit, and another circuit for selecting said standby memory cell array when said defective memory cell is accessed by the address signal supplying circuit coupled to said memory cell arrays, wherein the address signal supplying circuit, the memory cell arrays and standby memory cell arrays of the plurality of memory blocks, the access prohibition signal generating circuit, and the standby memory cell array selecting circuit are provided within a same semiconductor chip.

8. A semiconductor device having a redundancy memory system, according to claim 7, wherein said circuit for supplying address signals comprises an address input buffer.

9. A semiconductor memory device having a redundancy memory system comprising a circuit for supplying address signals; a row decoder for designating a row by decoding a row address signal; a column decoder for designating a column by decoding a column address signal; and a plurality of memory blocks, each of said memory blocks including:

a memory cell array, a standby memory cell array, a circuit for generating one of row and column access prohibition signals when a defective memory cell in a corresponding memory cell array is accessed by the address signals from the address signal supplying circuit and supplying the access prohibition signal to said corresponding memory cell array, wherein the number of address bits decoded by said access prohibition signal generating circuit of a respective memory block is smaller than that of the total number of address bits decoded by one of the row decoder and column decoder, and another circuit for selecting said standby memory cell array when said defective memory cell is accessed by the address signal supplying circuit coupled to the memory cell arrays of said plurality of memory blocks, wherein the row decoder, the column decoder, the address signal supplying circuit, the memory cell arrays and standby memory cell arrays of the plurality of memory blocks, the access prohibition signal generating circuit, and the standby memory cell array selecting circuit are provided within a same semiconductor chip.

10. A semiconductor device having a redundancy memory system, according to claim 9, wherein said circuit for supplying address signals comprises an address input buffer.

11. A microprocessor including a central processing unit and a semiconductor memory, the improvement wherein the semiconductor memory is facilitated with defect relief capability and comprises:

a memory having a memory array constituted by a plurality of memory mats, in which data can be written thereinto and read out therefrom, and at least one standby memory cell array, wherein said memory is divided into a plurality of memory blocks, each one of said at least one standby memory cell array being associated with a respective one or more of the memory blocks and each of said plurality of memory blocks including a memory mat, a separate address circuit for accessing memory cells of that memory block, a circuit for generating an access prohibition signal when a defective memory cell in that memory block is accessed and another circuit for selecting that one of said at least one standby memory cell array associated therewith when said defective memory cell is accessed by the address circuit of that memory block, and wherein the number of address bits for designating a defective memory cell in a memory block having the defective memory cell to be accessed by said access prohibition signal is smaller than the number of address bits required for designating a memory cell of said memory array on said device as a whole.

12. A defect relief semiconductor memory device according to claim 11, wherein each memory mat constitutes a separate memory cell array.

13. A defect relief semiconductor memory device according to claim 11, wherein each memory mat consists of a block of memory cells constituting one or more columns of memory cells.

14. A defective memory relief system for relieving a defect in a semiconductor memory device comprising a memory and a redundant memory, wherein said memory is divided into a plurality of memory blocks each of which has a memory mat, an address circuit coupled to said memory mat and has a standby memory cell array assigned thereto, the memory mats of said plurality of memory blocks together constitute a memory array, wherein said relief system avoids a defective memory cell in a selected memory mat, when an address of said defective memory cell is received from said address circuit coupled to that memory mat, by decoding instead said address into an address of said standby memory cell array assigned thereto, the number of address bits for designating a defective memory cell in a memory block having the defective memory cell to be accessed by said access prohibition signal is smaller than the number of address bits required for designating a memory cell of said memory array on said device as a whole, and wherein a separate plurality of program elements for generating an access prohibition signal to prevent addressing defective memory cells in said respective blocks are provided at each one of said plurality of memory blocks, and positional information of each of the memory blocks, including the location of any defective memory cell therein, is stored in each of said plurality of program elements based on which memory block each respective program element corresponds to.

15. A defective memory relief system according to claim 14, further comprising an additional program element other than said plurality of program elements, said additional program element being adapted to store address information of said redundant memory for selecting a redundant memory cell when said address circuit is attempting to access a defective memory cell.

16. A defective memory relief system according to claim 14, wherein at least one of the program elements is adapted to enable a part of said memory blocks to always be non-selective.

17. A defect relief semiconductor memory device according to claim 14, wherein each memory mat constitutes a separate memory cell array.

18. A defect relief semiconductor memory device according to claim 14, wherein each memory mat consists of a block of memory cells constituting one or more columns of memory cells.

* * * * *